US010163942B2

(12) United States Patent
Chung et al.

(10) Patent No.: US 10,163,942 B2
(45) Date of Patent: Dec. 25, 2018

(54) SOURCE DRIVER, AN IMAGE DISPLAY ASSEMBLY AND AN IMAGE DISPLAY APPARATUS

(71) Applicant: Samsung Electronics Co., Ltd., Suwon-si, Gyeonggi-do (KR)

(72) Inventors: Ye-chung Chung, Hwaseong-si (KR); Hee-seok Lee, Yongin-si (KR); Yun-seok Choi, Hwaseong-si (KR); Keung-beum Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 177 days.

(21) Appl. No.: 15/375,885

(22) Filed: Dec. 12, 2016

(65) Prior Publication Data
US 2017/0092663 A1 Mar. 30, 2017

Related U.S. Application Data

(63) Continuation of application No. 13/242,394, filed on Sep. 23, 2011, now Pat. No. 9,557,616.

(30) Foreign Application Priority Data

Sep. 24, 2010 (KR) .......................... 10-2010-0092857

(51) Int. Cl.
G06F 3/038 (2013.01)
H03K 3/00 (2006.01)
(Continued)

(52) U.S. Cl.
CPC ...... H01L 27/1244 (2013.01); G02F 1/13452 (2013.01); G09G 3/20 (2013.01);
(Continued)

(58) Field of Classification Search
CPC ........ G02F 1/13452; G09G 2300/0426; G09G 2310/08; G09G 2330/021; G09G 3/20;
(Continued)

(56) References Cited

U.S. PATENT DOCUMENTS 6,639,589 B1 10/2003 Kim et al.
6,657,606 B2 12/2003 Kang et al.
(Continued)

FOREIGN PATENT DOCUMENTS

KR 2000-0066493 A 11/2000
KR 2002-0008263 A 1/2002
(Continued)

OTHER PUBLICATIONS

Office Action for Corresponding Korean Application No. KR 10-2010-0092857 dated Apr. 28, 2016.
(Continued)

Primary Examiner — Kwin Xie
(74) Attorney, Agent, or Firm — Harness, Dickey & Pierce, P.L.C.

(57) ABSTRACT

According to example embodiments, an image display panel assembly includes a flexible printed circuit (FPC), an image display panel, at least one gate driver integrated circuit (IC) package, and at least one source driver IC package. The FPC is configured to receive gate and source driving signals. The image display panel is electrically connected to the FPC, and includes a gate driving signal transfer pattern along a first edge of the image display panel, a source driving signal transfer pattern along a second edge adjacent to the first end, and a plurality of pixels. The at least one gate driver integrated circuit (IC) package is configured to receive the gate driving signal through the gate driving signal transfer pattern and configured to provide the gate driving signal to gate lines of the plurality of pixels. The at least one source
(Continued)

driver IC package is configured to receive the source driving signal through the source driving signal transfer pattern and configured to provide the source driving signal to source lines of the plurality of pixels.

20 Claims, 11 Drawing Sheets

(51) Int. Cl.

| | | |
|---|---|---|
| *H01L 27/12* | (2006.01) | |
| *G02F 1/1345* | (2006.01) | |
| *G09G 3/20* | (2006.01) | |
| *H01L 23/00* | (2006.01) | |
| *H01L 25/10* | (2006.01) | |
| *H05K 1/14* | (2006.01) | |

(52) U.S. Cl.
CPC .............. *H01L 24/13* (2013.01); *H01L 24/16* (2013.01); *H01L 24/73* (2013.01); *H01L 25/105* (2013.01); *H05K 1/148* (2013.01); *G09G 2300/0426* (2013.01); *G09G 2310/08* (2013.01); *G09G 2330/021* (2013.01); *H01L 2224/13124* (2013.01); *H01L 2224/13639* (2013.01); *H01L 2224/16225* (2013.01); *H01L 2224/73204* (2013.01); *H01L 2924/1426* (2013.01)

(58) Field of Classification Search
CPC . H01L 2224/13124; H01L 2224/13639; H01L 2224/16225; H01L 2224/73204; H01L 24/13; H01L 24/16; H01L 24/73; H01L 25/105; H01L 27/1244; H01L 2924/1426; H05K 1/147

USPC .......................................... 345/204; 327/106
See application file for complete search history.

(56) References Cited

U.S. PATENT DOCUMENTS

| | | | | |
|---|---|---|---|---|
| 2002/0140654 | A1* | 10/2002 | Kim ................... | G02F 1/13452 345/87 |
| 2002/0180686 | A1 | 12/2002 | Yuda et al. | |
| 2004/0017536 | A1* | 1/2004 | Takenaka ............ | G02F 1/13452 349/150 |
| 2004/0056331 | A1* | 3/2004 | Chen ................... | G02F 1/13452 257/629 |
| 2005/0286004 | A1* | 12/2005 | Lee ....................... | G02F 1/1345 349/148 |
| 2010/0321623 | A1* | 12/2010 | Wakita ................. | G02F 1/1309 349/149 |

FOREIGN PATENT DOCUMENTS

| | | |
|---|---|---|
| KR | 2002-0091764 A | 12/2002 |
| KR | 2003-0037167 A | 5/2003 |

OTHER PUBLICATIONS

Office Action for Corresponding Korean Application No. KR 10-2010-0092857 dated Oct. 27, 2016.

* cited by examiner

SOURCE DRIVER, AN IMAGE DISPLAY ASSEMBLY AND AN IMAGE DISPLAY APPARATUS

CROSS-REFERENCE TO RELATED APPLICATIONS

This application is a continuation of and claims priority under 35 U.S.C. § 120/121 to U.S. application Ser. No. 13/242,394, filed on Sep. 23, 2011, which claims priority under 35 U.S.C. § 119 to Korean Patent Application No. 10-2010-0092857, filed on Sep. 24, 2010, in the Korean Intellectual Property Office, the disclosures of each of which are incorporated herein in their entirety by reference.

BACKGROUND

Example embodiments relate to an image display apparatus, and more particularly, to an image display apparatus including an image display panel assembly.

An image display apparatus includes a plurality of image display devices. The image display devices may display respective different images based on a voltage applied to a source terminal, in response to turn-on signals of a gate terminal. The image display apparatus may include source and gate driver integrated circuits (ICs) for applying signals to source terminals and gate terminals of the image display devices.

SUMMARY

According to example embodiments of the inventive concepts, an image display panel assembly includes a flexible printed circuit (FPC) configured to receive gate and source driving signals, an image display panel electrically connected to the FPC, the image display panel including a gate driving signal transfer pattern along a first edge of the image display panel, a source driving signal transfer pattern along a second edge adjacent to the first end, and a plurality of pixels, at least one gate driver integrated circuit (IC) package configured to receive the gate driving signal through the gate driving signal transfer pattern and configured to provide the gate driving signal to gate lines of the plurality of pixels, and at least one source driver IC package configured to receive the source driving signal through the source driving signal transfer pattern and configured to provide the source driving signal to source lines of the plurality of pixels.

According to example embodiments of the inventive concepts, the at least one source driver IC package includes a base substrate bonded to the image display panel and including a flexible insulating material, a source driver IC mounted on the base substrate and configured to receive and provide the source driving signal, a source driving signal input pattern electrically connected to the source driver IC and receives the source driving signal, and a source driving signal output pattern electrically connected to the source driver IC and provides the source driving signal to the source lines of the plurality of pixels.

According to example embodiments of the inventive concepts, the source driving signal input pattern and the source driving signal output pattern extend towards the image display panel.

According to example embodiments of the inventive concepts, the FPC is on a corner portion between the first edge and the second edge of the image display panel.

According to example embodiments of the inventive concepts, the FPC is on a portion of the second edge of the image display panel.

According to example embodiments of the inventive concepts, the at least one source driver IC package and the at least one gate driver IC package are chip-on-film (CoF) packages.

According to example embodiments of the inventive concepts, the gate driving signal transfer pattern electrically connects the FPC to the at least one gate driver IC package or connects the at least one gate driver IC package to at least one other gate driver IC package.

According to example embodiments of the inventive concepts, the image display panel assembly further includes a printed circuit board (PCB) electrically connected to the FPC. The PCB includes a semiconductor chip configured to provide the gate and source driving signals.

According to example embodiments of the inventive concepts, an image display panel assembly includes a flexible printed circuit (FPC) electrically connected to an image display panel and configured to provide gate and source driving signals, a plurality of gate driving signal transfer patterns along a first edge of the image display panel, and a plurality of source driving signal transfer patterns along a second edge adjacent to the first edge, the plurality of gate driving signal transfer patterns configured to transfer the gate driving signal and the plurality of source driving signal transfer patterns configured to transfer the source driving signal, a plurality of gate driver integrated circuit (IC) packages along the first edge of the image display panel, the plurality of gate driver IC packages configured to receive the gate driving signal through the gate driving signal transfer patterns, and configured to transfer the gate driving signal to an adjacent gate driver IC package or to provide the gate driving signal to the image display panel, and a plurality of source driver IC packages along the second edge of the image display panel, the plurality of source driver IC packages configured to receive the source driving signal through the source driving signal transfer patterns, and configured to transfer the source driving signal to an adjacent source driver IC package or to provide the source driving signal to the image display panel.

According to example embodiments of the inventive concepts, the image display panel assembly, further includes a printed circuit board (PCB) including a semiconductor chip configured to communicate with an external device to receive an image signal. The semiconductor chip is configured to generate the source and gate driving signals, and provide the source and gate driving signals to the FPC.

According to example embodiments of the inventive concepts, the PCB is bent towards and fixed at a rear surface of the image display panel.

According to example embodiments of the inventive concepts, the PCB is bent and fixed in a direction perpendicular to a surface of the image display panel.

According to example embodiments of the inventive concepts, each of the plurality of source driver IC packages includes a base substrate on the image display panel and including a flexible insulating material, a source driver IC on the base substrate and configured to receive and to provide the source driving signal, a source driving signal input pattern electrically connected to the source driver IC and in a direction of the image display panel, the source driving signal input pattern configured to receive a source transfer driving signal included in the source driving signal, a source driving signal output pattern electrically connected to the source driver IC and in a direction of the image display panel, the source driving signal output pattern configured to provide the source transfer driving signal to source electrodes of a plurality of pixel electrodes, and a source driving signal via pattern on the base substrate and configured to transfer a via source driving signal included in the source driving signal.

According to example embodiments of the inventive concepts, each of the plurality of source driver IC packages further includes a sorted source driving signal transfer pattern electrically connected to the source driver IC and in a direction of the image display panel, the sorted source driving signal transfer pattern configured to output a sorted source driving signal that is sorted by the source driver IC.

According to example embodiments of the inventive concepts, the FPC is bonded to a portion of the second edge of the image display panel.

According to example embodiments of the inventive concepts, an image display apparatus includes the image display panel assembly.

According to example embodiments of the inventive concepts, a source driver integrated circuit (IC) package includes a source driver IC, a source driving signal input pattern connected to the source driver IC and configured to input source driving signals to the source driver IC, and a source driving signal output pattern connected to the source driver IC and configured to output the source driving signals received from the source driver IC.

According to example embodiments of the inventive concepts, the source driver IC package, further includes a sorted source driving signal transfer pattern configured to output the source driving signals received from the source driver IC to another source driver IC package.

According to example embodiments of the inventive concepts, the source driver IC package, further includes a source driving signal via pattern configured to bypass the source driver IC and output the source driving signals to another source driver IC package.

According to example embodiments of the inventive concepts, a display panel includes a plurality of source driver IC packages on a first edge, a plurality of gate driver IC packages on a second edge adjacent to the first edge, a source driving signal transfer pattern connected to the source driving signal output pattern of the source driver IC package, and a gate driving signal transfer patterns configured to connect the source driver IC package to at least one gate driver IC package.

According to example embodiments of the inventive concepts, an image display apparatus includes the display panel.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
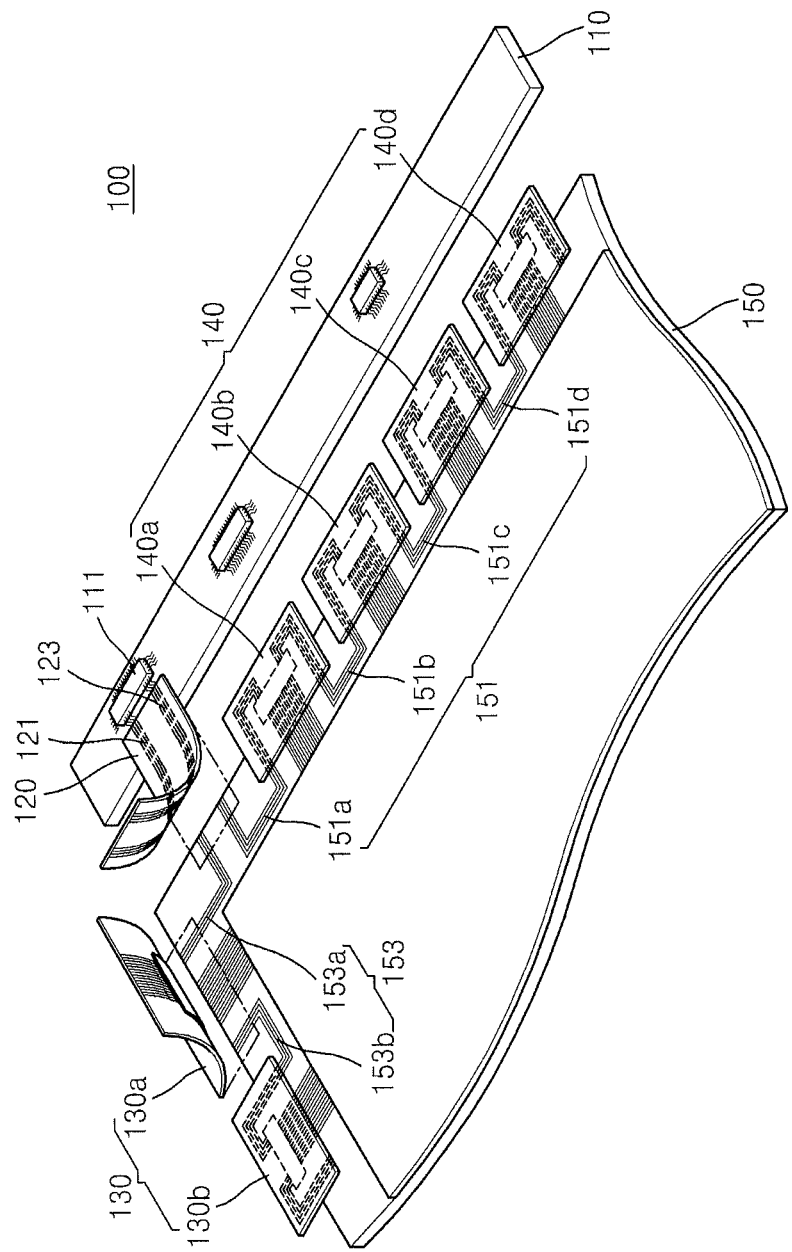
FIG. 1 is a perspective view of an image display panel assembly according to example embodiments of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", an and the are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view of an image display panel assembly 100 according to example embodiments of the inventive concepts.

Referring to FIG. 1, the image display panel assembly 100 may include a printed circuit board (PCB) 110, a flexible printed circuit (FPC) 120, gate driver integrated circuit (IC) packages 130, source driver IC packages 140, and an image display panel 150.

The PCB 110 may include a semiconductor chip 111 that receives an image signal from an external device such as a host and provides source and gate driving signals. The PCB 110 may include an epoxy resin, a polyimide resin, a bismaleimide triazine (BT) resin, flame retardant (FR)-4, FR-5, ceramic, silicon, or glass, as an example and the example embodiments are not limited thereto. The PCB 110 may include a single layer or a multilayered structure including wiring patterns formed therein. For example, the PCB 110 may be formed by a single rigid plate, may be formed by attaching a plurality of rigid plates to each other, or may be formed by attaching a thin flexible PCB and a rigid plate to each other. The rigid plates attached to each other or the PCB 110 may each include wiring patterns.

The PCB 110 may include a timing controller (not shown), and a transmission/reception circuit (not shown) that communicates with an external device such as a host, and transmits and receives signals to and from the external device. The PCB 110 may include the semiconductor chip 111 that provides the source and gate driving signals for displaying an image with appropriate timing.

The FPC 120 is electrically connected to the PCB 110 and transmits the source and gate driving signals to the PCB 110. A portion of the FPC 120 is bonded to the PCB 110, and another portion of the FPC 120 is bonded to the image display panel 150. The FPC 120 may be bonded to the image display panel 150 by thermo-compressing the FPC 120 on the image display panel 150 with an anisotropic conductive film (ACF) as a medium. For example, the FPC 120 may be bonded to a corner portion where a first end/edge of the image display panel 150 and a second end/edge adjacent to the first end/edge meet each other, wherein the gate driver IC packages 130 are bonded to the first end/edge, and the source driver IC packages 140 are bonded to the second end/edge. However, this arrangement of the gate driver IC packages 130 and the source driver IC packages 140 is not limited thereto and can be varied per design requirements.

The FPC 120 may include a gate driving signal connection pattern 121 for providing gate driving signals, and a source driving signal connection pattern 123 for providing source driving signals. The gate driving signal connection pattern 121 and the source driving signal connection pattern 123 may be configured as separate FPCs formed on respective base substrates. However, in example embodiments of FIG. 1, the gate driving signal connection pattern 121 and the source driving signal connection pattern 123 are formed on a single base substrate.

The FPC 120 is flexible. Thus, during assembly of the image display panel assembly 100, the FPC 120 may be bent towards and fixed to a rear surface of the image display panel 150, or alternatively, the FPC 120 may be bent in a direction perpendicular to a surface of the image display panel 150, and then may be fixed to the surface.

The FPC 120 may function as a connector for electrically connecting the PCB 110 and the image display panel 150 to each other by coating a conductive material, for example, including a copper foil, on a flexible base film of the FPC 120.

The base film of the FPC 120 may include at least one of a polyamide film, a polyester film, and a glass cloth epoxy. The FPC 120 may include only wirings, and thus suffer negligible damage even if the FPC 120 is deformed due to external shock.

The FPC 120 provides the source and gate driving signals to the source driver IC packages 140 and the gate driver IC packages 130, respectively. The gate driving signal connection pattern 121 may receive the gate driving signals from the semiconductor chip 111 mounted on the PCB 110, and may provide the gate driving signals to the gate driver IC packages 130 through a first gate driving signal transfer pattern 153a. The source driving signal connection pattern 123 may receive the source driving signals from the semiconductor chip 111, and may provide the source driving signals to the source driver IC packages 140 through a first source driving signal transfer pattern 151a.

The FPC 120 is bonded to the corner portion where the first end/edge of the image display panel 150 and the second end/edge adjacent to the first end/edge meet each other, wherein, for example, the gate driver IC packages 130 are bonded to the first end/edge, and the source driver IC packages 140 are bonded to the second end/edge. In this case, the gate driving signals and the source driving signals may be sequentially transmitted in respective predetermined directions.

The gate driving signals are provided to a second gate driver IC package 130b from the FPC 120 through a first gate driver IC package 130a. In addition, the source driving signals are provided to a first source driver IC package 140a from the FPC 120 so that some of the source driving signals corresponding to source transfer driving signals may be provided to source lines that are electrically connected to the first source driver IC package 140a, and other remaining source driving signals corresponding to via source driving signals may be provided to a second source driver IC package 140b through the first source driver IC package 140a. Similarly, some of the source driving signals are provided to source lines that are electrically connected to the second source driver IC package 140b, and the other remaining source driving signals are provided to a third source driver IC package 140c.

Thus, when the gate and source driving signals are provided to at least one of the packages of the gate driver IC packages 130 and at least one of the packages of the source driver IC packages 140 from the PCB 110 through a single FPC 120, the signals may also be transferred.

According to example embodiments, since the source and gate driving signals are provided from the PCB 110 through the FPC 120, stress generated on the image display panel assembly 100 may be reduced when both the gate driver IC packages 130 and the source driver IC packages 140 are bonded to the image display panel 150 and the PCB 110.

The image display panel assembly 100 may experience reduced stress due to external shock by providing the gate and source driving signals to the gate driver IC packages 130 and the source driver IC packages 140 through the FPC 120, compared with a case where the source and gate driving signals are provided directly through the PCB 110.

The gate driver IC packages 130 may be bonded to portions of the first end/edge of the image display panel 150 along the first end/edge of the image display panel 150.

The gate driver IC packages 130 may include the first and second gate driver IC packages 130*a* and 130*b*, and may receive the gate driving signals provided from the FPC 120 through the image display panel 150. The image display panel 150 may include first and second gate driving signal transfer patterns 153*a* and 153*b* that extend along an end/edge of the image display panel 150. At least one of the first and second gate driving signal transfer patterns 153*a* and 153*b* may be electrically connected to the FPC 120, for example, the gate driving signal connection pattern 121 formed on the FPC 120, so as to receive the gate driving signals, and may provide the gate driving signals to the gate driver IC packages 130.

Each of the first and second gate driver IC packages 130*a* and 130*b* may receive corresponding gate driving signals, and may transmit the corresponding gate driving signals to a next gate driver IC package, or to gate lines of a plurality of pixels included in the image display panel 150.

For example, the first gate driver IC package 130*a* may be electrically connected to the FPC 120 through the first gate driving signal transfer pattern 153*a* so as to receive the gate driving signals.

The first and second gate driver IC packages 130*a* and 130*b* may receive the gate driving signals sorted into gate driving signals to be transmitted to gate lines that are electrically connected to the first and second gate driver IC packages 130*a* and 130*b*, and gate driving signals to be transmitted to another gate driver IC package adjacent to the first and second gate driver IC packages 130*a* and 130*b*. For example, the first gate driver IC package 130*a* may receive both the gate driving signals to be transmitted to gate lines that are electrically connected to the first gate driver IC package 130*a*, and the gate driving signals to be transmitted to the second gate driver IC package 130*b*. In this case, with regard to the first gate driver IC package 130*a*, the gate driving signals to be transmitted to gate lines that are electrically connected to the first gate driver IC package 130*a* are referred to as gate transfer driving signals, and the gate driving signals to be transmitted to the second gate driver IC package 130*b* are referred to as via gate driving signals. These terminologies will be used throughout this specification, and will be correspondingly used for the source driving signals.

According to example embodiments of the inventive concepts, the gate driving signals may be signals for sequentially activating the gate lines that are electrically connected to the first and second gate driver IC packages 130*a* and 130*b*, and thus the gate transfer driving signals and the via gate driving signals may be substantially the same gate driving signals.

The first gate driver IC package 130*a* provides the via gate driving signals of the gate driving signals received by the first gate driving signal transfer pattern 153*a* to the second gate driver IC package 130*b* adjacent to the first gate driver IC package 130*a* through the second gate driving signal transfer pattern 153*b*. The first gate driver IC package 130*a* provides the gate transfer driving signals of the gate driving signals to the gate lines that are electrically connected to the first gate driver IC package 130*a*.

According to example embodiments of the inventive concepts, the gate driving signals are sorted into the gate transfer driving signals and the via gate driving signals by gate driver ICs that are respectively included in the first and second gate driver IC packages 130*a* and 130*b*, or by respective wirings when being provided from the PCB 110. When the gate transfer driving signal and the via gate driving signal are provided by the respective wirings, the gate transfer driving signal and the via gate driving signal may be provided through respective wirings also in the first and second gate driver IC packages 130*a* and 130*b*. The gate transfer driving signals may be provided to the gate driver ICs through gate driving signal input patterns, and may be provided to the gate lines of the pixels included in the image display panel 150 through gate driving signal output patterns. The via gate driving signals may move between adjacent gate driver IC packages 130 through a gate driving signal via pattern.

The source driver IC packages 140 may include first through fourth source driver IC packages 140*a*, 140*b*, 140*c*, and 140*d*, and may be bonded to portions of the second end/edge of the image display panel 150 along the second end/edge adjacent to the first end/edge of the image display panel 150 so as to receive the source driving signals from the FPC 120 through the image display panel 150.

According to example embodiments of the inventive concepts, the image display panel 150 may include first through fourth source driving signal transfer patterns 151*a*, 151*b*, 151*c* and 151*d* that extend along the second end/edge of the image display panel 150. At least one of the first through fourth source driving signal transfer patterns 151*a*, 151*b*, 151*c* and 151*d* is electrically connected to the FPC 120, and thus the image display panel 150 may receive the source driving signals and may provide the source driving signals to the source driver IC packages 140. For example, the first source driving signal transfer pattern 151*a* may be electrically connected to the source driving signal connection pattern 123 formed on the FPC 120, and thus may receive the source driving signals and may provide the source driving signals to the first source driver IC package 140*a*.

The first through fourth source driver IC packages 140*a*, 140*b*, 140*c*, and 140*d* may receive the respective source driving signals, and may provide the respective source driving signals to adjacent source driver IC packages, and/or may provide the respective source driving signals to source lines of the pixels included in image display panel 150.

For example, the second source driver IC package 140*b* may receive the source driving signals from the first source driver IC package 140*a* adjacent to the second source driver IC package 140*b*, and may provide the source transfer driving signals included in the source driving signals to the source lines included in the image display panel 150 that is electrically connected to the second source driver IC package 140*b*. In addition, the second source driver IC package 140*b* may transmit the via source driving signals included in the source driving signals received from the first source driver IC package 140*a* to the third source driver IC package 140*c*. According to example embodiments of the inventive concepts, the source driving signals are sorted into the source transfer driving signals and the via source driving signals by source driver ICs included in the first through fourth source driver IC packages 140*a*, 140*b*, 140*c*, and 140*d*, or by respective wirings when being provided from the PCB 110. In each of the first through fourth source driver IC packages 140*a*, 140*b*, 140*c*, and 140*d*, the via source driving signals are transmitted to an adjacent source driver IC package through a source driving signal via patterns formed across the first through fourth source driver IC packages 140*a*, 140*b*, 140*c*, and 140*d*, and a base substrate of the first through fourth source driver IC packages 140*a*, 140*b*, 140*c*, and 140*d*. The source transfer driving signals may be provided to the first through fourth source driver IC packages 140*a*, 140*b*, 140*c*, and 140*d* through source driving signal input patterns.

However, the same source driving signals may be provided to the source driver IC packages 140 rather than being sequentially provided to the image display panel 150. The first through fourth source driver IC packages 140*a*, 140*b*, 140*c*, and 140*d* may classify provided source transfer driving signals, and may provide the source transfer driving signals to the source lines. Structures of the source driver IC packages 140 will be described later.

The image display panel 150 may include a glass substrate on which a plurality of pixels are formed, and a color filter substrate formed on the glass substrate so as to face the pixels. For example, the image display panel 150 may include a liquid crystal display (LCD), organic light emission diode (OLED), or the like. The color filter substrate may have a smaller size than the glass substrate, and may include red, green, and blue (RGB) pixels formed by developing and etching photoresist including RGB pigments.

The pixels formed on the glass substrate are connected between a plurality of gate lines and a plurality of source lines, and may include at least one of a transparent indium tin oxide (ITO) electrode and indium zinc oxide (IZO) electrode.

The image display panel 150 receives and stores source driving voltages corresponding to the source driving signals, is turned-on in response to the gate driving signals, and displays an image based on the source driving voltages.

Figure 2A:
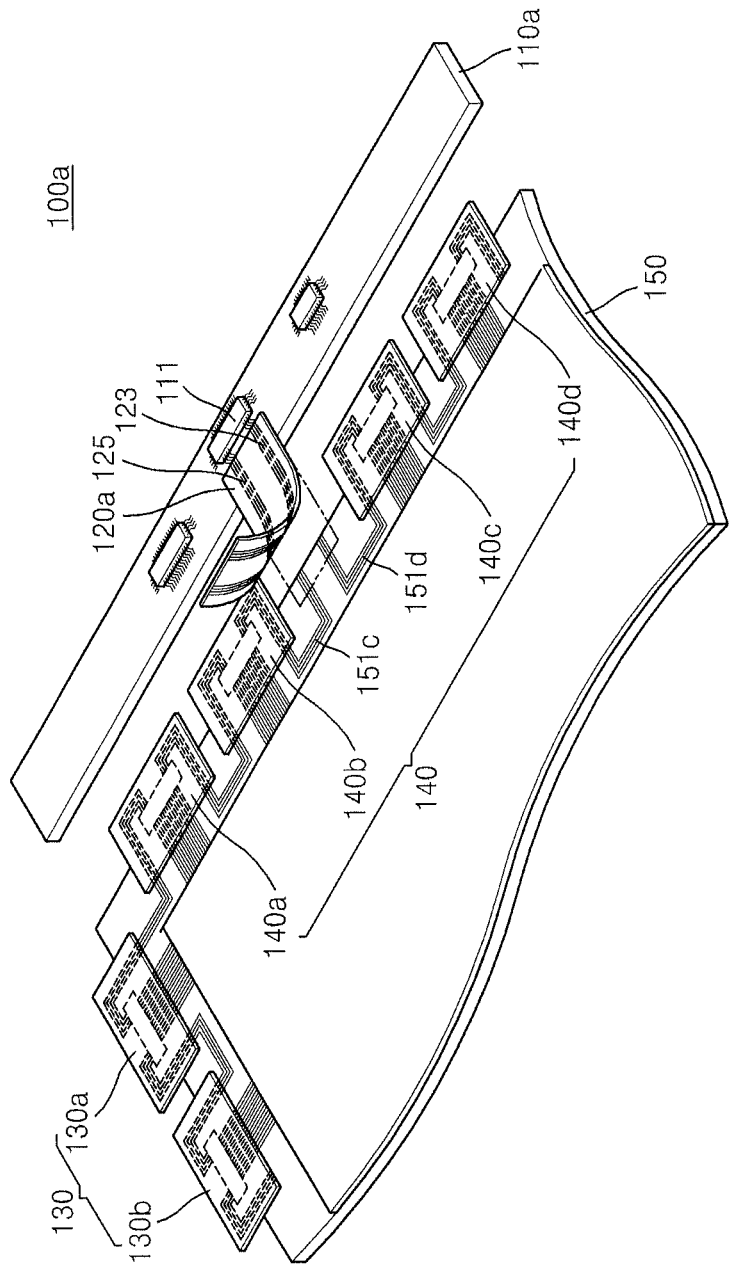
FIGS. 2A through 2C are perspective views of image display panel assemblies according to example embodiments of the inventive concepts.
Figure 2B:
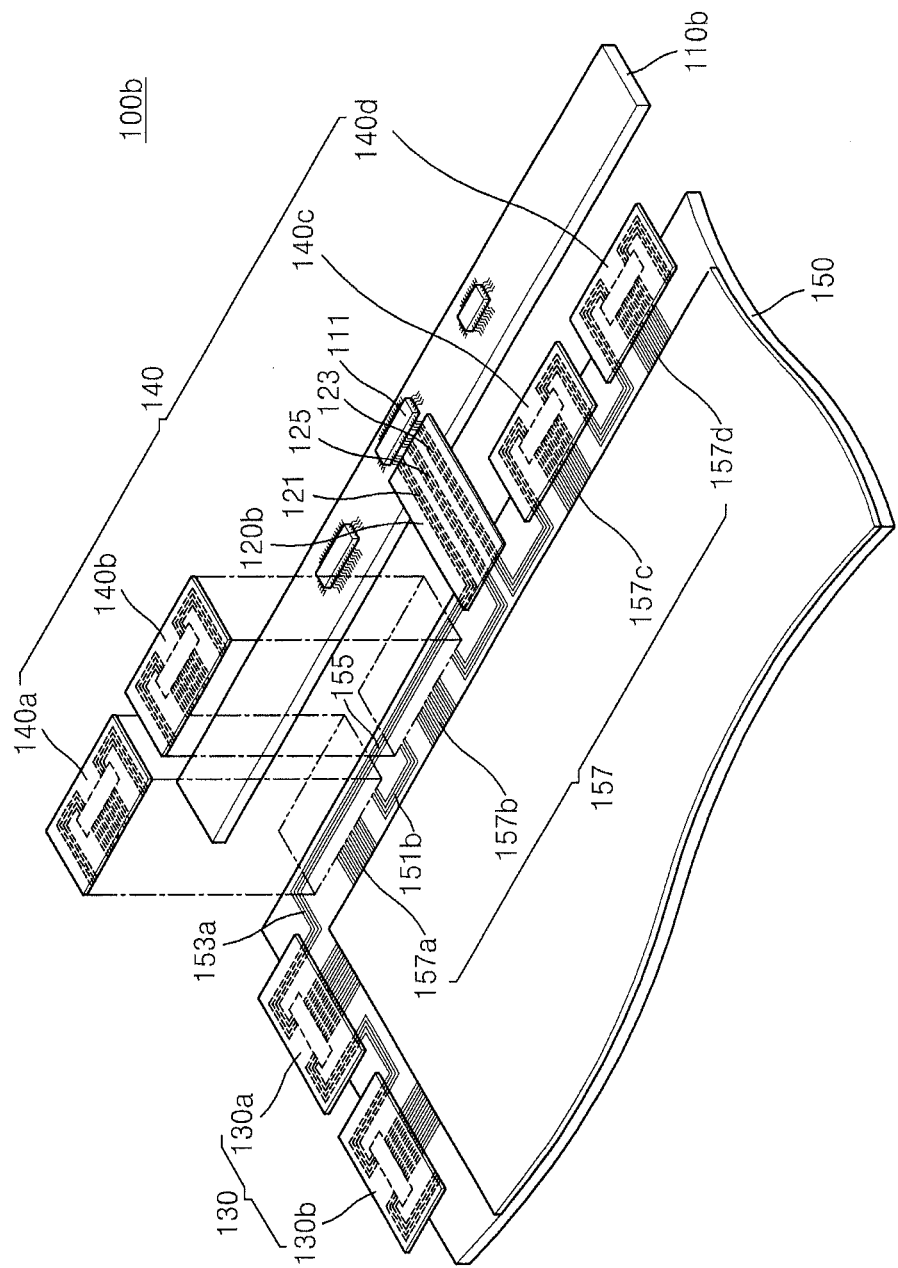
Figure 2C:
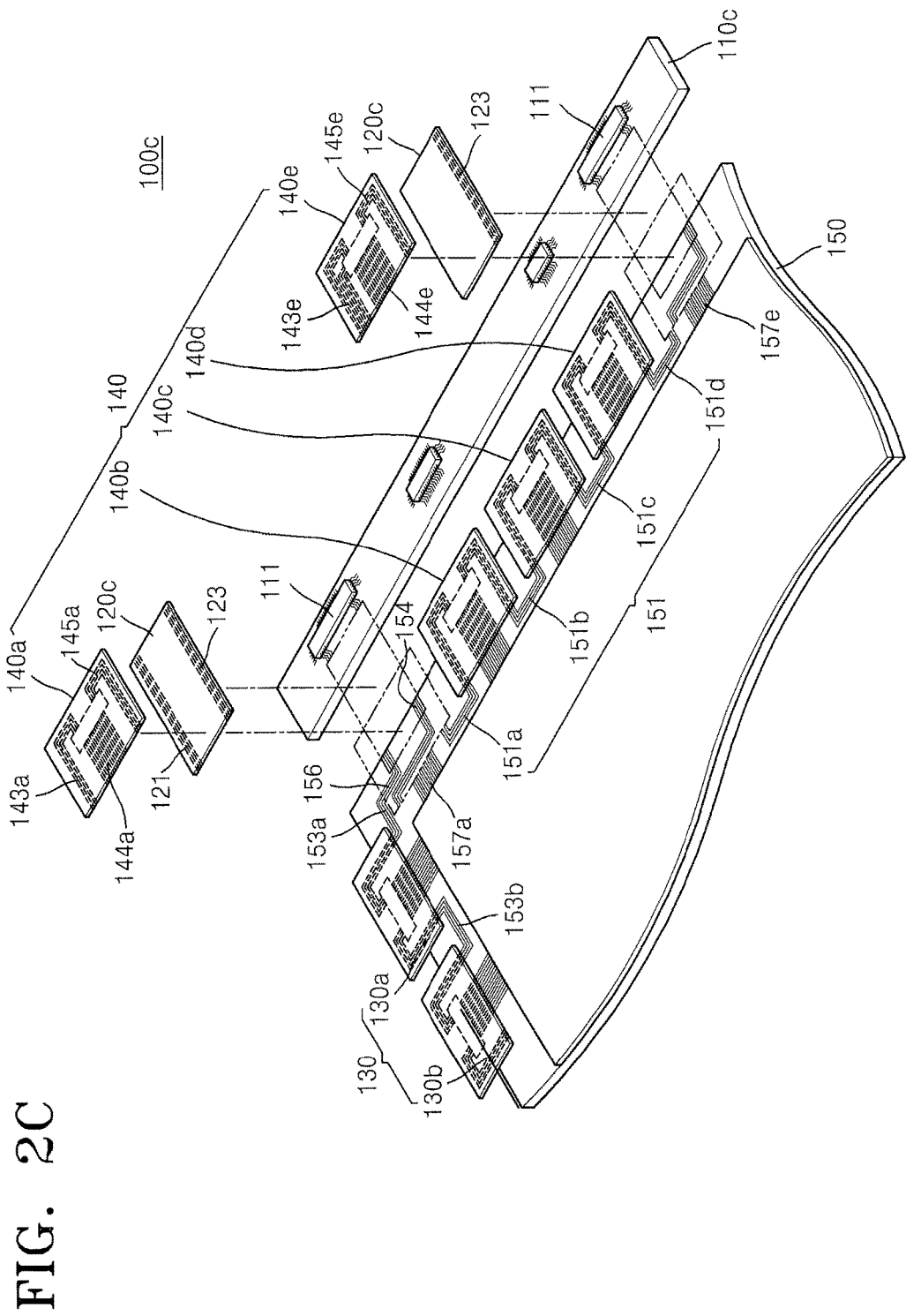

FIGS. 2A through 2C are perspective views of image display panel assemblies 100*a*, 100*b*, and 100*c* according to example embodiments of the inventive concepts.

Referring to FIGS. 2A through 2C, FPCs 120*a*, 120*b*, and 120*c* are bonded to different locations than that of the FPC 120 of FIG. 1, or source and gate driving signals are transmitted through different paths even though the FPCs 120*a*, 120*b*, and 120*c* are bonded to the same location. Components that are not described herein are substantially the same as in FIG. 1. In addition, like reference numerals in the drawings denote like elements, and thus their description will be omitted.

Referring to FIG. 2A, the image display panel assembly 100*a* may include the FPC 120*a* bonded to a substantially central portion of the second end/edge of the image display panel 150 to which the source driver IC packages 140 are bonded.

The FPC 120*a* is bonded to the image display panel 150 in substantially the same manner as in FIG. 1. Power voltages for an operation of the image display panel assembly 100*a* may be applied through a PCB 110*a* so as to drive the gate driver IC packages 130 and the source driver IC packages 140, and may be applied to the image display panel 150. The power voltages may be provided through the same path as that of the gate and source driving signals. Thus, when the gate and source driving signals are sequentially provided, the power voltages may be sequentially provided. While the power voltages pass through a plurality of driver IC packages, a loss in the power voltages may occur.

When the loss in the power voltages occurs, since appropriate power voltages for operations of the driver IC packages may not be applied to the driver IC packages, malfunction is likely to be caused. The loss in the power voltages may be proportional to a distance between the FPC 120*a* and each driver IC package. For example, in FIG. 1, the loss in the power voltage applied to the fourth source driver IC package 140*d* may be the greatest among the first through fourth source driver IC packages 140*a*, 140*b*, 140*c*, and 140*d*.

When the FPC 120*a* is bonded substantially to the central portion between the source driver IC packages 140, the power voltage may be applied around the FPC 120*a*. In this case, with regard to the image display panel assembly 100*a*, distances between the FPC 120*a*, and the first through fourth source driver IC packages 140*a*, 140*b*, 140*c*, and 140*d* may be minimized as compared to FIG. 1, and thus the loss in the power voltages of the image display panel assembly 100*a* may be reduced.

In addition, the distances between the FPC 120*a* and the first through fourth source driver IC packages 140*a*, 140*b*, 140*c*, and 140*d* may be related to signal delay. Thus, when the FPC 120*a* is bonded to the central portion, the signal delay may also be minimized.

In FIG. 2A, the gate driving signals may be provided through the first and second source driver IC packages 140*a* and 140*b* that are bonded between the first and second source driver IC packages 130*a* and 130*b* and the FPC 120*a*. That is, the gate driving signals may be provided through the same path as that of the source driving signals and a source IC. The source and gate driving signals may be provided to the third source driving signal transfer pattern 151*c* through a source and gate driving signal connection pattern 125 formed on the FPC 120*a*, and provided from the third source driving signal transfer pattern 151*c*.

The source and gate driving signals may be provided into a source driver IC included in the first and second source driver IC packages 140*a* and 140*b*, or alternatively, through the source driving signal via patterns formed on the first and second source driver IC packages 140*a* and 140*b*.

In addition, the source driving signals may be provided to the third and fourth source driver IC packages 140*c* and 140*d* through the source driving signal connection pattern 123 and the fourth source driving signal transfer pattern 151*d*.

FIG. 2B illustrates a case where the gate driving signals are provided directly to the gate driver IC packages 130 through the image display panel 150 without passing through the source driver IC packages 140.

Referring to FIG. 2B, the FPC 120*b* is bonded substantially to a central portion between the source driver IC packages 140 on the image display panel 150. The FPC 120*b* includes the source driving signal connection pattern 123, the gate driving signal connection pattern 121, and the source and gate driving signal connection pattern 125. The gate driving signal connection pattern 121 is electrically connected to the first gate driving signal transfer pattern 153*a* through a via gate driving signal transfer pattern 155. The via gate driving signal transfer pattern 155 may be formed on a portion of the image display panel 150 to which the first and second source driver IC packages 140*a* and 140*b* are bonded in order to prevent short circuits from occurring between the via gate driving signal transfer pattern 155 and source line patterns 157*a* and 157*b* to which source lines are electrically connected to the first and second source driver IC packages 140*a* and 140*b*. Thus, gate driving signals provided from FPC 120*b* may be transmitted directly to the gate driver IC packages 130 through the via gate driving signal transfer pattern 155.

According to example embodiments of the inventive concepts, the gate driving signals may be provided through the source and gate driving signal connection pattern 125, and may be provided to the gate driver IC packages 130 through the first and second source driver IC packages 140a and 140b. As described with reference to FIG. 1, the gate driving signals may be input to the source driver ICs included in the first and second source driver IC packages 140a and 140b and may be sorted, and then may be provided to the gate driver IC packages 130, or may be provided to the gate driver IC packages 130 only through the base substrate of the first and second source driver IC packages 140a and 140b.

The source driving signals may be provided to the first and second source driver IC packages 140a and 140b through the source and gate driving signal connection pattern 125, and may be provided to the third and fourth source driver IC packages 140c and 140d through the source driving signal connection pattern 123. Since any pattern for providing the gate driving signals is not formed on source line patterns 157c and 157d of which source lines are electrically connected to the third and fourth source driver IC packages 140c and 140d, the source line patterns 157c and 157d may also be formed on a portion of the image display panel 150 to which the third and fourth source driver IC packages 140c and 140d are bonded.

Referring to FIG. 2C, the FPC 120c is bonded to a portion of the image display panel 150 where at least one of the source driver IC packages 140 is bonded. For example, when the FPC 120c is bonded to the portion of the second end/edge of the image display panel 150, the source driver IC packages 140 may be bonded to the FPC 120c.

The gate driving signal generated from the semiconductor chip 111 of the PCB 110c may be provided to the first gate driving signal transfer pattern 153a through the gate driving signal connection pattern 121 of the FPC 120c, and a gate driving signal transfer pattern 156 of the image display panel 150. Thus, the gate driving signals may be provided directly to the gate driver IC packages 130.

The source driving signals generated from the semiconductor chip 111 of the PCB 110c may be provided to a first source driving signal input pattern 143a formed on the first source driver IC package 140a through a inner source driving signal transfer pattern 154. The source driving signals may pass through the first source driver IC package 140a, and then may be provided to source lines through a first source driving signal output pattern 144a and the source line pattern 157a, or may pass through a first sorted source driving signal transfer pattern 145a, and then may be sequentially provided to the second through fifth source driver IC packages 140b, 140c, 140d, and 140e through the first source driving signal transfer pattern 151a.

Since the FPC 120c and the source driver IC packages 140 are bonded and electrically connected to different portions of the image display panel 150, different wirings of the image display panel 150 may be designed in order to prevent short circuits from occurring between driving signals.

For example, only the source driving signal connection pattern 123 may be formed on the FPC 120c that is bonded to a lower portion of the fifth source driver IC package 140e. The source driving signals provided through the FPC 120c may be provided to a portion of a fifth source driving signal input pattern 143e through the source driving signal transfer pattern 154 formed on the image display panel 150. The portion of the fifth source driving signal input pattern 143e may be electrically connected to the fourth source driving signal transfer pattern 151d so as to receive the source driving signals from the fourth source driver IC package 140d.

When the source driver IC packages 140 are connected directly to the PCB 110c so as to receive the source driving signals, a loss in the source driving signals and signal delay may be reduced. However, during final assembly of the image display panel assembly 100c, the PCB 110c may be bent and fixed. Thus, the source driver IC packages 140 may be deformed according to the form of the PCB 110c. Since only a single end/edge of each of the source driver IC packages 140 is bonded to the image display panel 150, the source driver IC packages 140 may be less deformed due to external physical stress, compared with a case both ends of each of the source driver IC packages 140 are bonded to both the PCB 110c and the image display panel 150.

Although described later, wiring of the source driver IC packages 140 is formed of metal, such as copper (Cu). Thus, as the size of an image display apparatus is reduced, the thickness of the wiring of the source driver IC packages 140 is further reduced to, for example, about 8 μm. The fine wiring is vulnerable to crack, and to deformation of the source driver IC packages 140.

The image display panel 150 including the image display panel assembly 100a, 100b, or 100c may provide the source driving signals while minimizing deformation of the source driver IC packages 140, and thus a reliable operation of the image display apparatus may be ensured.

In FIG. 2C, the image display panel 100c a number of FPCs 120c may correspond to the number of the source driver IC packages 140. The FPC 120c may provide the source driving signals to the source driver IC packages 140, respectively. Thus, the source driving signals may be rapidly provided, and thus an operational speed, that is, a frame rate of the image display panel 150 may be increased, thereby improving a response speed.

FIGS. 2A through 2C illustrate the image display panel assemblies 100a, 100b, and 100c respectively including the FPCs 120a, 120b, and 120c that are formed on different locations and have different paths for driving signals, but the example embodiments are not limited thereto.

Figure 3A:
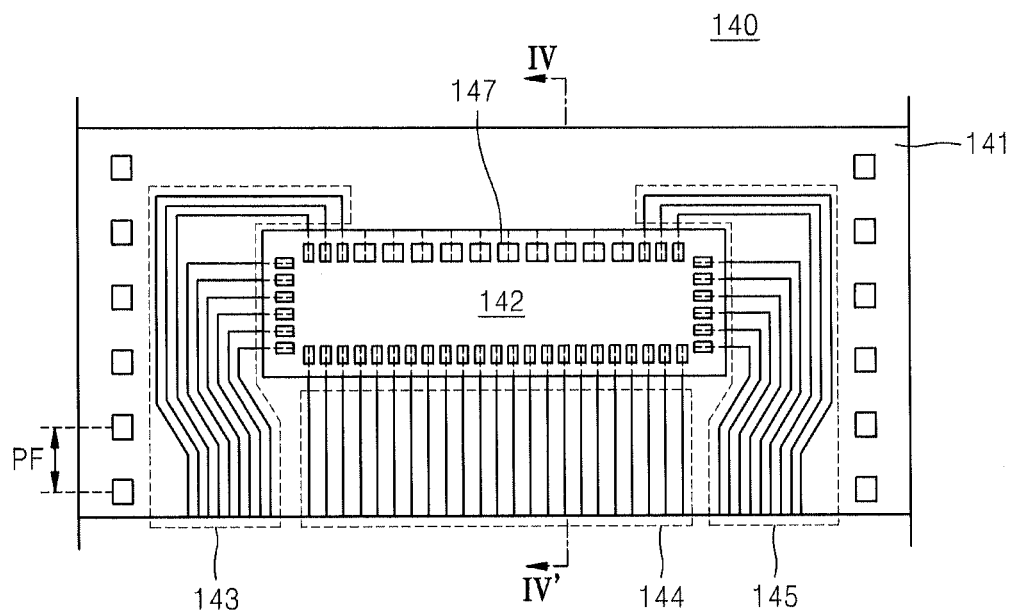
FIGS. 3A and 3B are plan views of source driver integrated circuit (IC) packages according to example embodiments of the inventive concepts.
Figure 3B:
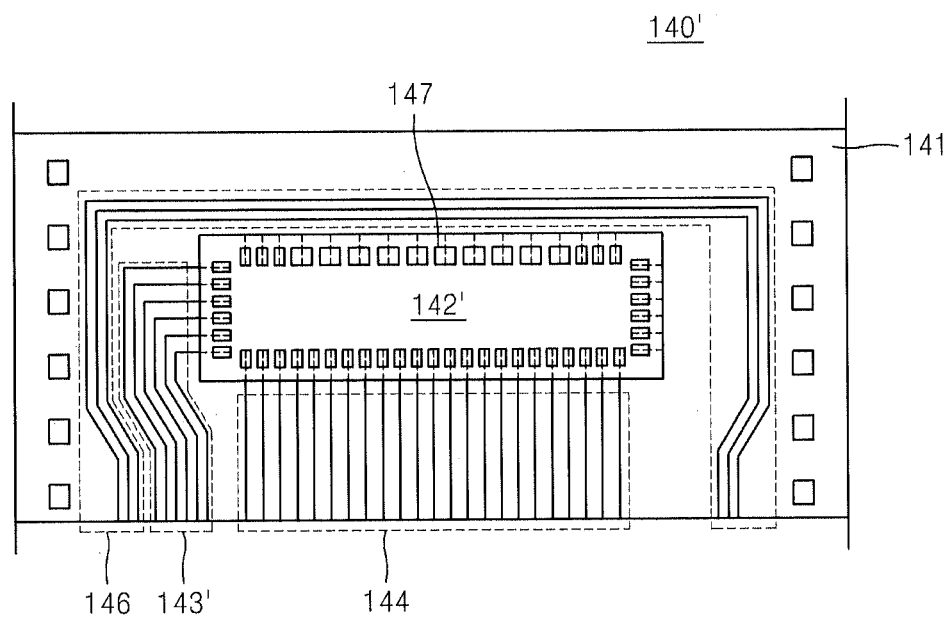

FIGS. 3A and 3B are plan views of source driver IC packages 140 and 140' according to example embodiments of the inventive concepts. The source driver IC packages 140 and 140' of FIGS. 3A and 3B may each be at least one of the first through fourth driver IC packages 140a, 140b, 140c, and 140d.

Referring to FIG. 3A, the source driver IC package 140 may include a base substrate 141, a source driver IC 142, a source driving signal input pattern 143, and a source driving signal output pattern 144.

The base substrate 141 may be bonded to the second end/edge of the image display panel 150. The base substrate 141 may be bonded to the image display panel 150 of FIGS. 1 through 2C by using an outer lead bonding (OLB) method with an anisotropic conductive film (ACF). The base substrate 141 may include a flexible insulating material. The flexible insulating material may be at least one of a polyimide resin, or an epoxy resin.

Sprocket holes similar to films are formed along both lateral ends of the base substrate 141. A distance between adjacent sprocket holes is referred to as PF. As the number of PFs of films required to manufacture the source driver IC package 140 is reduced, manufacturing costs of an image display apparatus may be reduced. When the source driver IC package 140 is bonded to the image display panel 150 of FIG. 1, the sprocket holes may be cut.

The source driving signal input pattern 143 and the source driving signal output pattern 144 may be formed on the base substrate 141. The source driving signal input pattern 143 may be electrically connected to source driving signal transfer patterns 151 formed on the image display panel 150 so as to receive the source driving signals. The source driving signal input pattern 143 extends towards the image display panel 150. In other words, the source driving signal input pattern 143 extends towards the second end/edge of the image display panel 150 to which the source driver IC package 140 is bonded.

For example, when the source driver IC package 140 is bonded between the PCB 110 and the image display panel 150, the source driver IC package 140 receives the source driving signal from the PCB 110, processes the received source driving signal, and provides the received source driving signal to the image display panel 150. Thus, the source driving signal input pattern 143 extends towards the PCB 110, and the source driving signal output pattern 144 extends towards the image display panel 150. Typically, if the PCB 110 and the image display panel 150 are positioned to face each other with respect to the source driver IC 142, the source driving signal input pattern 143 and the source driving signal output pattern 144 may extend in opposite directions.

However, according to example embodiments, the source driver IC package 140 receives the source driving signals through the source driving signal transfer patterns 151 formed on the image display panel 150, and provides the source driving signals processed by the source driver IC 142 to source lines included in the image display panel 150. Thus, both the source driving signal input pattern 143 receiving the source driving signals and the source driving signal output pattern 144 providing the source driving signals may extend towards the image display panel 150.

Thus, since the number of PFs of the source driver IC package 140 is reduced by as much as required when the source driving signal input pattern 143 and the image display panel 150 extend in opposite directions, manufacturing costs reduced.

The gate driver IC packages 130 of FIGS. 1 through 2C may each have substantially the same structure as the source driver IC package 140. The gate driver IC package 130 and the source driver IC package 140 may use the base substrate 141 having substantially the same PFs, and thus materials may be shared in forming the gate driver IC packages 130 and the source driver IC package 140.

According to example embodiments of the inventive concepts, sorted source driving signal transfer patterns 145 for providing sorted source driving signals to another source driver IC package may be formed on the base substrate 141.

The sorted source driving signals are substantially the same as the source via driving signals. However, throughout this specification the sorted source driving signals are signals that are sorted according a sorting operation of a signal sorter of the source driver IC 142 and then provided to another adjacent source driver IC package 140, and not provided through separate wirings.

When a source driving signal from among the source driving signals input through the source driving signal input pattern 143 corresponds to a signal to be provided to another adjacent source driver IC package, and not to a signal to be provided to source lines that are electrically connected to the source driver IC package 140, the source driving signal needs to be provided to another adjacent source driver IC package.

Thus, the source driving signals input from the source driver IC 142 are sorted into corresponding source driving signals and non-corresponding source driving signals. The sorted source driving signals corresponding to the non-corresponding source driving signals are provided to another adjacent source driver IC package through the sorted source driving signal transfer patterns 145, and act as source driving sources of the adjacent source driver IC package. The sorted source driving signal transfer patterns 145 are electrically connected to the source driving signal transfer patterns 151 formed on the image display panel 150. However, the source driving signal transfer patterns 151 connected to the sorted source driving signal transfer patterns 145, and the source driving signal transfer patterns 151 connected to the source driving signal input pattern 143 may be different from each other.

Although not illustrated, the base substrate, except for portions corresponding to portions of the source driver IC 142, the source driving signal input pattern 143 and the sorted source driving signal transfer patterns 145, may be covered by solder resist (SR)

The source driver IC 142 may receive the source driving signals through the source driving signal input pattern 143, may process the source driving signals, and then may provide the source driving signals to source lines formed on the image display panel 150 through the source driving signal output pattern 144.

According to example embodiments of the inventive concept, the source driver IC 142 may sort the source driving signals into corresponding source transfer driving signals and sorted source driving signals. An operation of the source driver IC 142 will be described later in detail.

The source driver IC 142 may be mounted in the form of flip chip, or may be electrically connected to each pattern by using a wire-bonding method.

The source driver IC package 140 may include a tape carrier package (TCP), a chip-on-film (COF) package, and a thermally-enhanced chip-on-film (TECOF) package. The TCP is mounted on an inner lead exposed through a window formed in a tape wiring substrate by using a semiconductor inner lead bonding (ILB) method. The COF package has a structure in which a semiconductor chip is mounted on a tape wiring substrate having no window by using a flip-chip bonding method. The TECoF package may increase heat dissipation effects by attaching a thin film metal tape with high thermal conductivity on the COF.

The source driver IC 142 may be electrically connected to patterns through bumps 147.

Referring to FIG. 3B, the source driver IC package 140' may include a source driving signal via pattern 146 formed on the base substrate 141, wherein the source driving signals pass through the source driving signal via pattern 146 without being input to the source driver IC 142.

Compared with the source driver IC package 140 of FIG. 3A, the source driver IC package 140' of FIG. 3B may receive the source transfer driving signals to be provided to source lines electrically connected to the source driver IC package 140', and via source driving signals to be provided to another adjacent source driver IC package, through different patterns. Thus, since only the source transfer driving signals are provided to a source driver IC 142', signals do not have to be sorted. The via source driving signals to be provided to another adjacent source driver IC package may be provided to the adjacent source driver IC package through the source driving signal via pattern 146. However, example embodiments are limited thereto, and the source driver IC package of FIG. 3A may also include the source driving signal via pattern 146 that may provide via source driving signals to another adjacent source driver IC package in addition to including the sorted source driving signal transfer patterns 145.

The source driving signal via pattern 146 and the source driving signal output pattern 144 receive the source driving signals through the source driving signal transfer patterns 151. However, the source driving signal transfer patterns 151 that are respectively connected to the source driving signal via pattern 146 and the source driving signal output pattern 144 may provide the via source driving signals and the source transfer driving signals, respectively.

Figure 4:
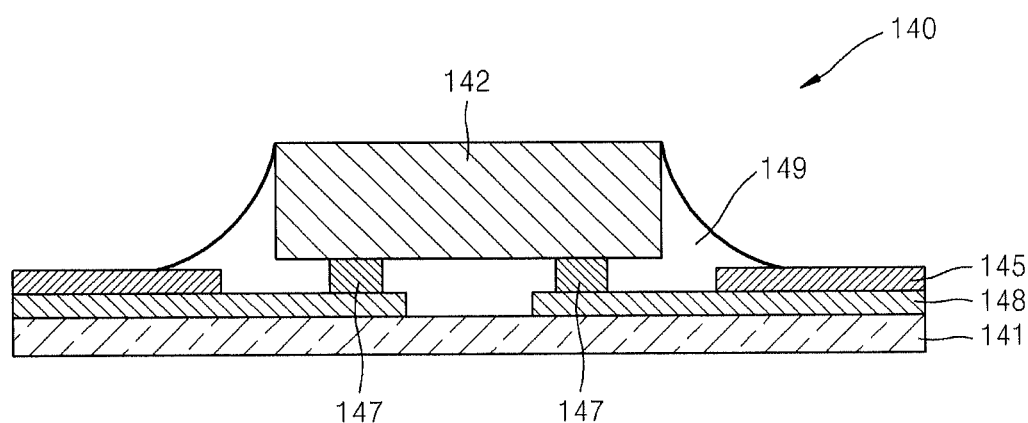
FIG. 4 is a cross-sectional view of the source driver IC package taken along a line IV-IV' of FIG. 3A.

FIG. 4 is a cross-sectional view of the source driver IC package 140 taken along a line IV-IV' of FIG. 3A.

Referring to FIG. 4, the source driver IC package 140 may include the base substrate 141, a pattern 145 formed on the base substrate 141, a solder resist 148, the bumps 147, an underfill resin 149, and the source driver IC 142.

The pattern 145 may include the source driving signal input pattern 143, the source driving signal output pattern 144, the sorted source driving signal transfer patterns 145, and the source driving signal via pattern 146. However, with regard to FIG. 4, the source driving signal input pattern 143, the source driving signal output pattern 144, the sorted source driving signal transfer patterns 145, and the source driving signal via pattern 146 will be collectively described as the pattern 145 using the same reference numeral as the sorted source driving signal transfer patterns 145. The pattern 145 may be formed by patterning a Cu foil. In addition, as described above, as an image display apparatus gets thinner, the thickness of the pattern 145 is further reduced, and thus the pattern 145 may be vulnerable to stress.

Break failure of the pattern 145 included in the source driver IC package 140 may occur mainly on both ends of the source driver IC package 140 on which stress concentrates when the PCB 110 is finally bonded to the source driver IC package 140. For example, when the source driver IC package 140 is bonded to the image display panel 150 by an ACF as a medium, Break failure may occur on the pattern 145 between the ACF and the solder resist 148.

Thus, in the image display panel assembly 100, the source driver IC package 140 receives the source driving signals through the image display panel 150 rather than being connected to the PCB 110, and thus fine patterns are negligibly damaged, thereby ensuring a reliable operation of the image display apparatus.

The solder resist 148 may be formed on the base substrate 141, except for portions corresponding to portions of the pattern 145. The solder resist 148 is formed of an insulating material and covers the pattern 145 in order to prevent short circuits from occurring between patterns, or between patterns and another device.

The bumps 147 are formed by plating silver (Ag) bumps on an aluminum (Al) electrode of the source driver IC 142 by using a barrier metal as a medium. Two electrodes are heated and pressured so as to bond to each other to obtain Ag—Sn bonding, and thus the source driver IC 142 and the pattern 145 are electrically connected.

The underfill resin 149 may include a material with a high modulus of elasticity and a low coefficient of thermal expansion (CTE), and may reduce a stress between the base substrate 141 and the source driver IC 142 during a bonding process.

Figure 5:
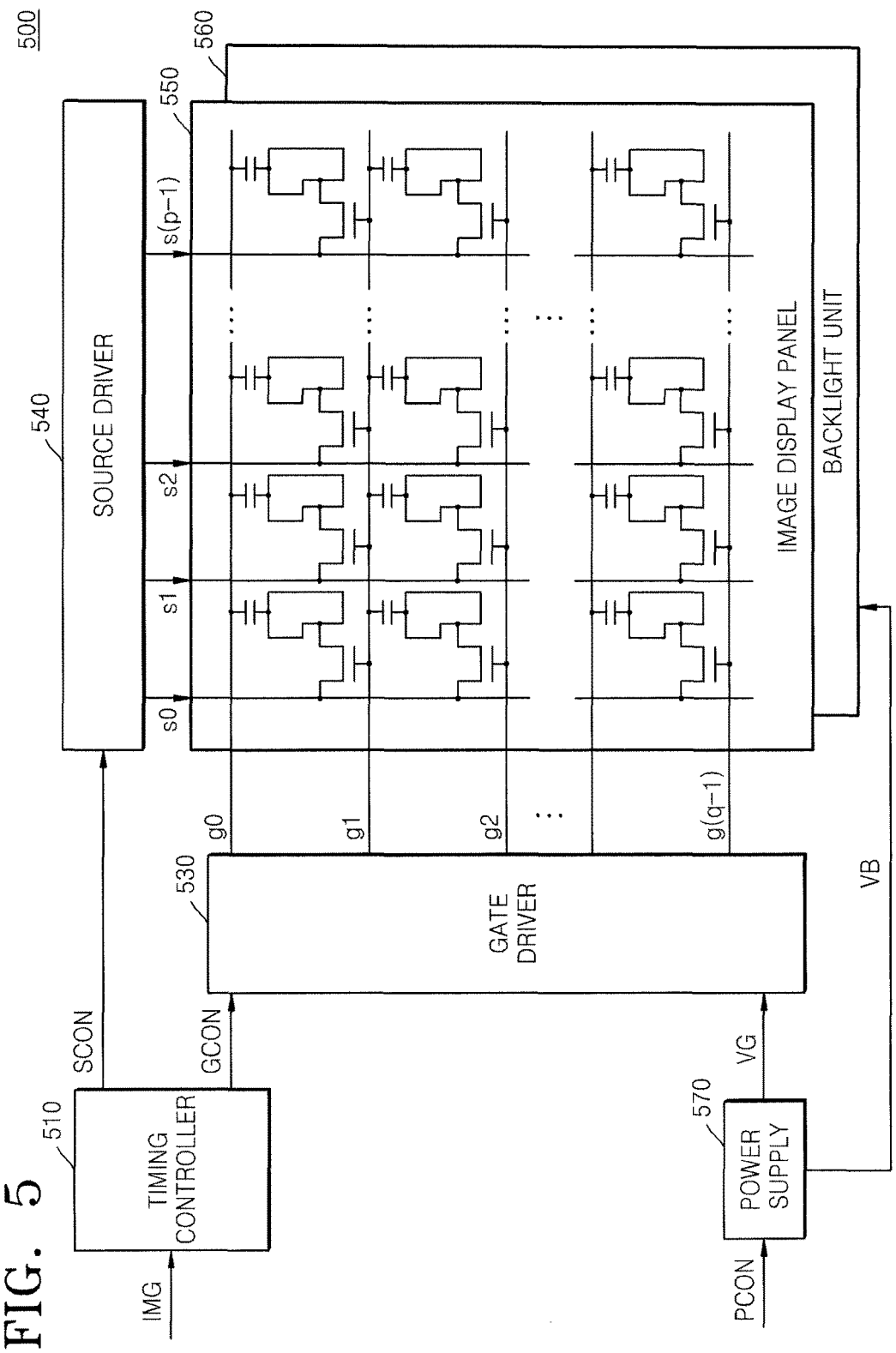
FIG. 5 is a functional block diagram of an image display apparatus including an image display panel assembly, according to example embodiments of the inventive concepts.

FIG. 5 is a functional block diagram of an image display apparatus including an image display panel assembly 500, according to example embodiments of the inventive concepts.

Referring to FIG. 5, the image display panel assembly 500 may include a timing controller 510 included in the PCB 110, a source driver 540 including at least one source driver IC package 140, a gate driver 530 including at least one gate driver IC package 130, and an image display panel 550.

Components of FIG. 5 have different reference numerals from those described with reference to FIGS. 1 through 4 in order to explain functions of the components.

The image display panel assembly 500 may correspond to at least one of the image display panel assemblies 100, 100a, 100b, and 100c described with reference to FIGS. 1 through 2C. The PCB 110 may correspond to the timing controller 510. According to example embodiments of the inventive concepts, the PCB 110 may be expressed by another block other than the timing controller 510. The gate driver IC packages 130 may each correspond to the gate driver 530, the source driver IC packages 140 may each correspond to the source driver 540, and the image display panel 150 may correspond to the image display panel 550.

Since the FPC 120 performs only a function of transferring the source and gate driving signals provided by the PCB 110, a functional block corresponding to the FPC 120 is not illustrated in FIG. 5.

The timing controller 510 may receive an image signal IMG from an external device, such as a host, and may provide a source driving signal SCON, and a gate driving signal GCON. The timing controller 510 may include a receiving terminal for receiving an image signal of high speed that is serialized from the external device, a data processing terminal that parallelizes and restores the serialized image signal back to the original image signal in order to transmit the image signal to source and gate drivers, and that performs temporal distribution on data so that the restored image signal may be distributed to the source and gate drivers for driving each pixel of the image display panel 550 in a timely manner, a clock generator for generating a carrier frequency used to transmit clocks and data that are used in the timing controller 510, and a transmitting terminal for transmitting the image signal distributed by the timing controller 510 to the source and gate drivers.

The timing controller 510 may transmit and receive the image signal IMG to and from the external device by using various methods such as low-voltage differential signaling (LVDS), a digital video interface (DVI), a high definition multimedia interface (HDMI), and a display port.

The timing controller 510 may transmit and receive the source driving signal SCON and the gate driving signal GCON by using methods such as reduced swing differential signaling (RSDS), mini-LVDS, and point-to-point differential signaling (PPDS).

The image signal IMG may include a clock signal, an image information signal, vertical and horizontal synchronization signals, and the like. When the image display panel 550 is a panel that realizes colors, the image information signal may contain image information of R, G, and B colors.

The source driver 540 may receive the source driving signal SCON, and may provide a plurality of source driving signals s0, s1, s2, through s(p−1) to a plurality of source lines included in the image display panel 550, respectively.

The source driver 540 may convert the source driving signal SCON received from the timing controller 510 by using a predetermined logical operation, and may provide a voltage value, which is converted to correspond to the source driving signal SCON based on a reference voltage, to the source driving signals s0, s1, s2, through s(p−1).

Each of the source driving signals s0, s1, s2, through s(p−1) provided to the source lines may be stored in a capacitor included in a corresponding pixel.

The gate driver 530 may sequentially transfer the gate driving signal GCON received from the timing controller 510, and may sequentially activate a plurality of gate lines included in the image display panel 550.

While the gate lines are sequentially activated, an image corresponding to a quantity of charge stored in capacitors is displayed by the source driving signals s0, s1, s2, through s(p−1), and may be maintained for a single frame.

According to example embodiments of the inventive concepts, the image display panel assembly 500 may further include a power supply 570.

The power supply 570 may receive a power control signal PCON from the external device, such as a host, and may provide voltages suitable for the components. In FIG. 5, the power supply 570 provides a gate voltage VG to the gate driver 530, and provides a backlight voltage VB to a backlight unit 560, but example embodiments are not limited thereto.

According to example embodiments of the inventive concepts, the image display panel assembly 500 may further include the backlight unit 560. The backlight unit 560 may include a cold cathode fluorescent lamp (CCFL), and a light emission diode (LED). When the image display panel assembly 500 includes the backlight unit 560, the image display panel assembly 500 may correspond to an image display apparatus. For convenience of description, the image display panel assembly 500 including the backlight unit 560 will be described with reference to FIG. 5.

The backlight unit 560 is disposed on a rear surface of the image display panel 550, receives the backlight voltage VB from the power supply 570 and generates plane light having uniform brightness, and provides the plane light to the image display panel 550. When the backlight unit 560 is an OLED, which is a self-emission light source, the backlight unit 560 may not be included in the image display panel assembly 500.

Figure 6A:
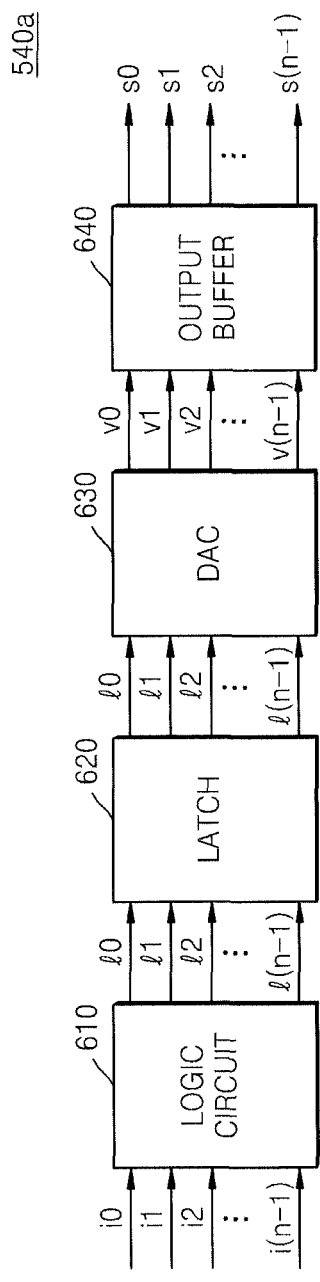
FIGS. 6A and 6B are blocks of source driver ICs, according to example embodiments of the inventive concepts.
Figure 6B:
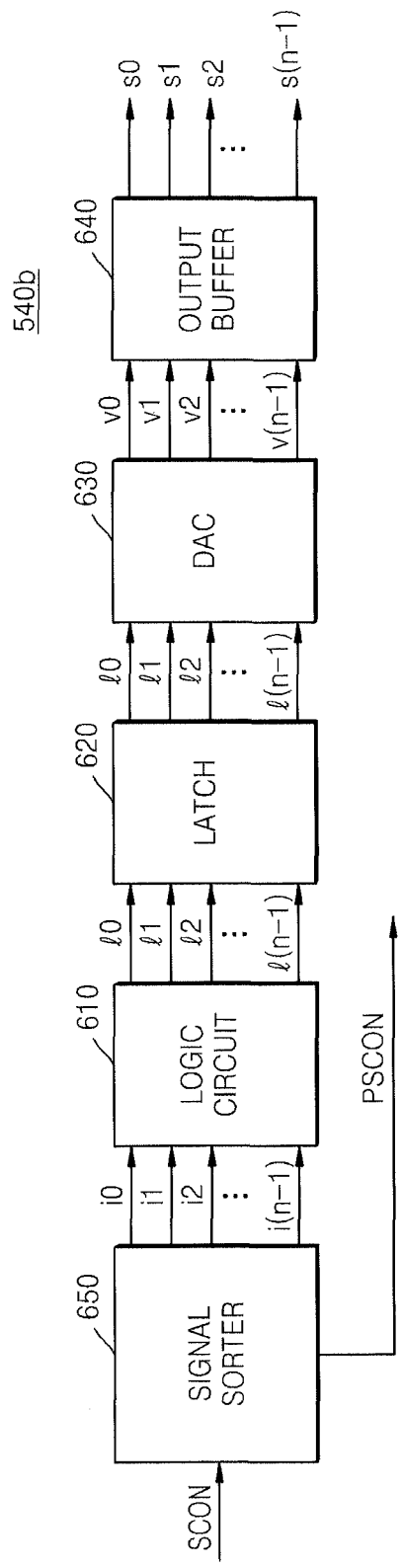

FIGS. 6A and 6B are blocks of source driver ICs 540a and 540b, according to example embodiments of the inventive concepts. The source driver ICs 540a and 540b may each correspond to the source driver IC 142 of FIGS. 3A, 3B, and 4, or the source driver 540 of FIG. 5. Different reference numerals are used to indicate the source driver ICs 540a and 540b, the source driver IC 142, and the source driver 540, in order to prevent confusion therebetween.

In FIG. 6A, the source transfer driving signals and the via source driving signals are provided through different patterns, and a source driver IC receives only the source transfer driving signals, which corresponds to a case where the source driving signals are not sorted like in FIG. 3B.

Referring to FIG. 6A, the source driver IC 540a may include a logic circuit 610, a latch 620, a digital-analog converter 630, and an output buffer 640.

The logic circuit 610 receives the source driving signal SCON, and performs a predetermined logical operation so as to obtain logic driving signals l0, l1, l2, through l(n−1). The logical operation may be changed according to a method of displaying an image in the image display panel 550 of FIG. 5. For example, the logic circuit 610 may sample the image information signal provided in series according to the vertical and horizontal synchronization signals so as to obtain the logic driving signals l0, l1, l2, through l(n−1).

The latch 620 may store the logic driving signals l0, l1, l2, through l(n−1), and may provide the logic driving signals l0, l1, l2, through l(n−1) to the digital-analog converter 630.

The digital-analog converter 630 may provide source voltage values v0, v1, v2, . . . , v(n−1) corresponding to the logic driving signals l0, l1, l2, through l(n−1) based on a reference voltage.

The output buffer 640 may provide the source voltage values v0, v1, v2, . . . , v(n−1) to corresponding source lines based on separate output signals.

FIG. 6B illustrates the source driver IC 540b when non-corresponding source driving signals are provided like in FIG. 3A. In FIG. 6B, the source driver IC 540b may further include a signal sorter 650 for outputting the non-corresponding source driving signals as sorted source driving signals, and transmitting the sorted source driving signals to another adjacent source driver IC package.

The signal sorter 650 sorts the source driving signal SCON into source transfer driving signals and sorted source driving signals PSCON. Signals may be sorted according to a predetermined standard.

Operations after the sort of the source driving signal SCON are substantially the same as in the source driver IC 540a of FIG. 6A, and thus will not be described herein.

Figure 7:
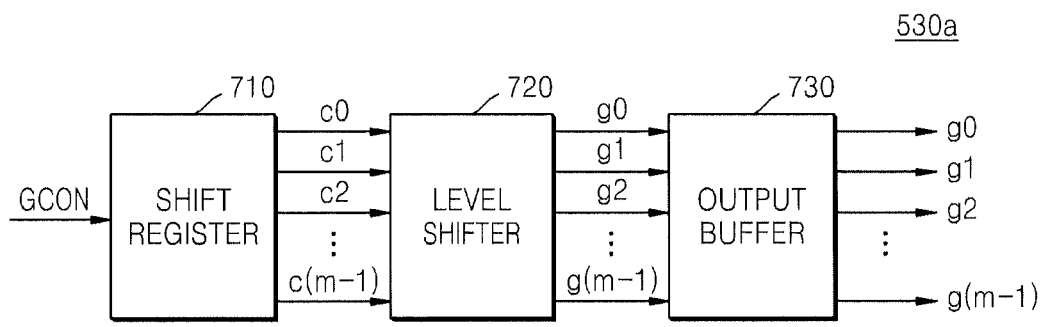
FIG. 7 is a block diagram of a gate driver IC, according to example embodiments of the inventive concepts.

FIG. 7 is a block diagram of a gate driver IC 530a, according to example embodiments of the inventive concepts. Like in FIGS. 6A and 6B, the gate driver IC 530a may be a gate driver IC included in the gate driver IC packages 130, and may correspond to the gate driver 530 of FIG. 5. In order to maintain consistency of the block diagram, the same reference numerals are used in FIG. 5 in order to describe the gate driver IC 530a.

Referring to FIG. 7, the gate driver IC 530a may include a shift register 710, a level shifter 720, and an output buffer 730.

The shift register 710 receives the gate driving signal GCON, and provides a plurality of level driving signals c0, c1, c2, through c(m−1) that are sequentially activated. The shift register 710 may operate in synchronization with a separate clock signal, and may include an oscillator, or the like.

The level shifter 720 levels the level driving signals c0, c1, c2, through c(m−1) up or down to appropriate voltage levels, and provides the level driving signals c0, c1, c2, through c(m−1) as a plurality of gate driving signals g0, g1, g2, through g(m−1).

The output buffer 730 may include buffers for rapidly providing the gate driving signals g0, g1, g2, through g(m−1) to a plurality of gate lines with a large load.

The gate driver IC 530a provides the gate driving signals g0, g1, g2, through g(m−1) that are sequentially activated to the gate lines included in the image display panel 550 of FIG. 5 so that a plurality of pixels may display images corresponding to source driving voltage values stored in capacitors.

However, the gate driver IC 530a may generate and provide the gate driving signals g0, g1, g2, through g(m−1) by using various methods according to a driving method of the image display panel 150 of FIG. 5, and thus example embodiments are not limited to the above-described methods.

Figure 8:
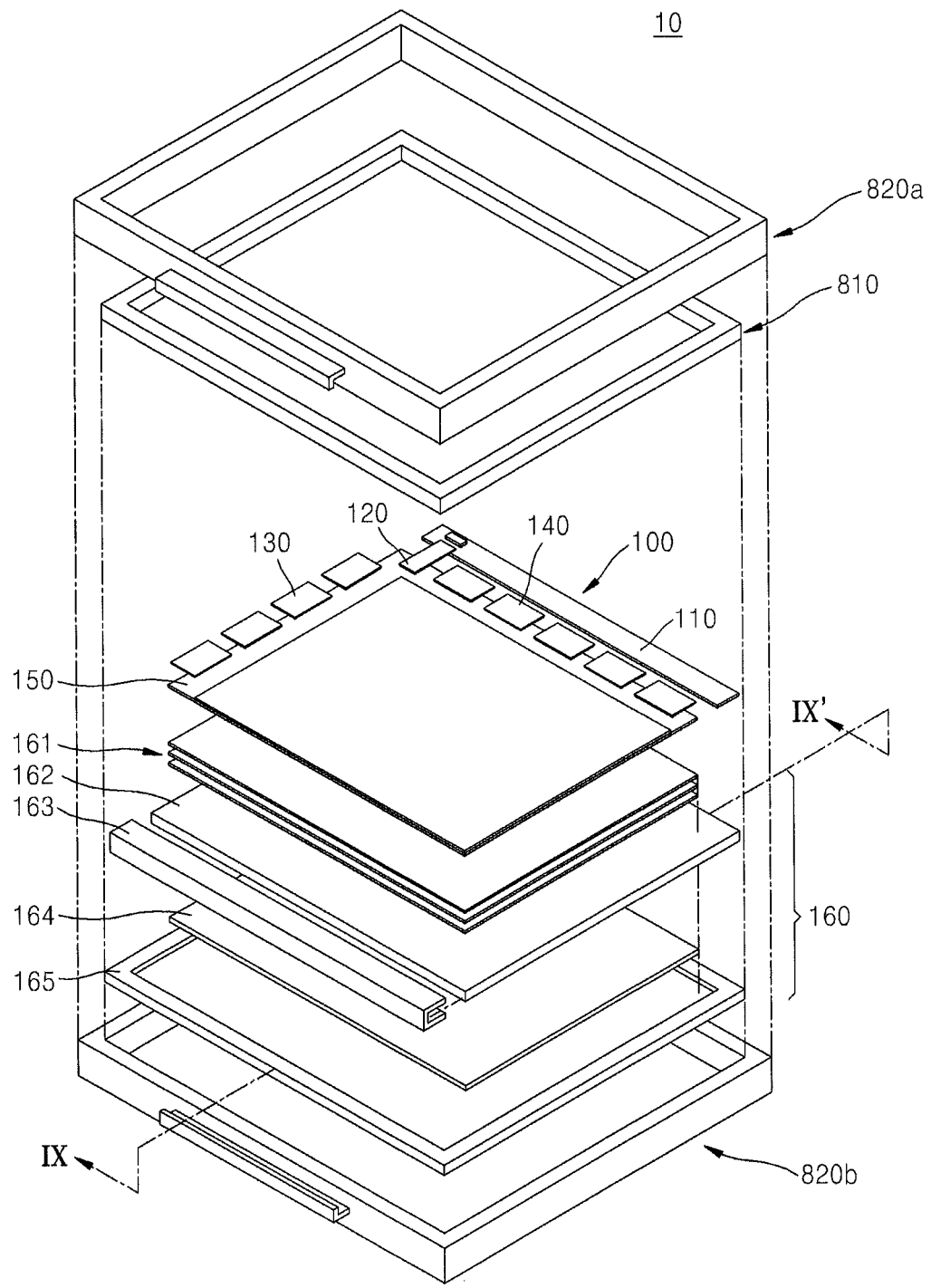
FIG. 8 is an exploded perspective view of an image display apparatus according to example embodiments of the inventive concepts.

FIG. 8 is an exploded perspective view of an image display apparatus 10 according to example embodiments of the inventive concepts.

As described with reference to FIG. 5, when the image display panel assembly 100 includes a backlight unit 160 corresponding to the backlight unit 560 of FIG. 5, the image display panel assembly 100 corresponds to the image display apparatus 10. However, in FIG. 8, the image display apparatus 10 includes the image display panel assembly 100, and other components. Therefore, in FIG. 8, components are separately referred from the image display panel assembly 100, and the entirety of FIG. 8 shows the image display panel assembly 100.

Referring to FIG. 8, the image display apparatus 10 may include the image display panel assembly 100, the backlight unit 160, a chassis 810, and upper and lower cases 820a and 820b.

The image display panel assembly 100 may include the PCB 110, the FPC 120, the gate driver IC packages 130, the source driver IC packages 140, and the image display panel 150.

The image display panel assembly 100 includes the PCB 110 for processing source and gate driving signals, and the FPC 120 for receiving the source and gate driving signals from the PCB 110 and providing the source and gate driving signals to source and gate driving signal transfer patterns formed on the image display panel 150, and only a single end of each of the gate driver IC packages 130 and the source driver IC packages 140 is fixed so as to prevent the gate driver IC packages 130 and the source driver IC packages 140 from being damaged due to external stress.

The backlight unit 160 may include an optical sheet 161, a light guide plate 162, a lamp assembly 163, a reflective plate 164, and a mold frame 165.

The optical sheet 161, the light guide plate 162, the lamp assembly 163, and the reflective plate 164 may be accommodated in the mold frame 165 in the order stated, and the image display panel 150 is fixed onto the optical sheet 161 by the chassis 810.

During assembly for fixing the image display panel assembly 100 by the chassis 810, the PCB 110 may be bent and fixed in a perpendicular direction to a surface of the image display panel 150, or may be fixed to a rear surface of the image display panel 150, that is, to a rear portion of the backlight unit 160.

According to where the PCB 110 is disposed, the FPC 120 may be bent. In the image display apparatus 10, the source driver IC packages 140 are connected to the PCB 110 through the FPC 120 in order to prevent patterns of the source driver IC packages 140 from being damaged when the PCB 110 is bonded directly to each of the source driver IC packages 140, thereby ensuring a reliable operation for transmitting driving signals.

The image display apparatus 10 may be protected by the upper case 820a and the lower case 820b.

Figure 9A:
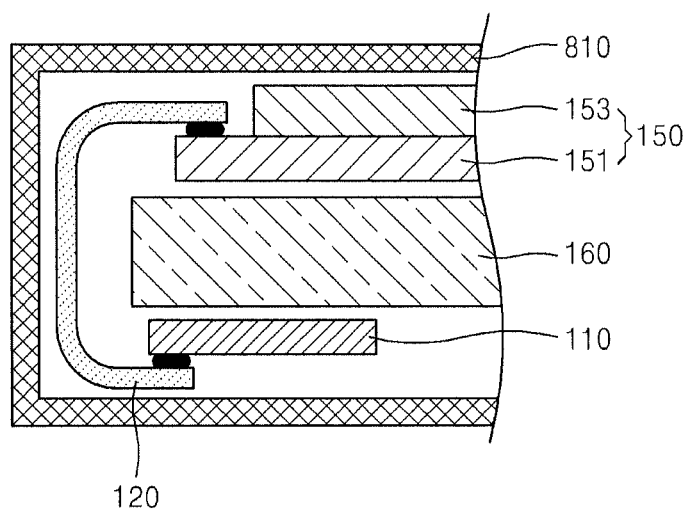
FIGS. 9A and 9B are cross-sectional views of image display apparatuses each of which correspond to the image display apparatus taken along a line IX-IX' of FIG. 8, according to example embodiments of the inventive concepts.
Figure 9B:
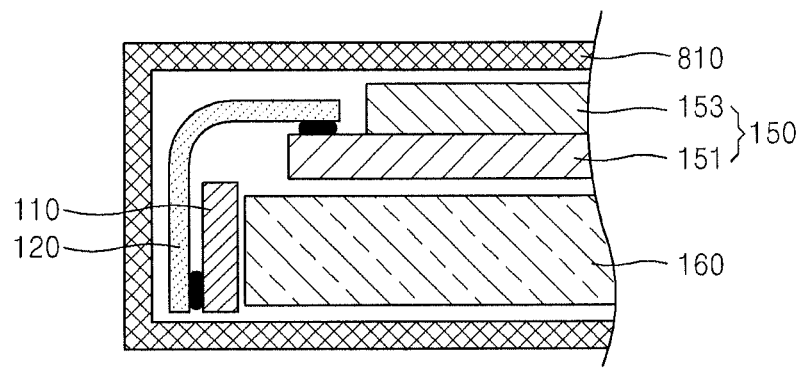

FIGS. 9A and 9B are cross-sectional views of image display apparatuses 10a and 10b each of which corresponds to the image display apparatus 10 taken along a line IX-IX' of FIG. 8, according to example embodiments of the inventive concepts. In FIGS. 9A and 9B, the PCB 110 is fixed to different portions, and some components of FIG. 8 are not illustrated.

Referring to FIG. 9A, the image display apparatus 10a may include the PCB 110 that is fixed at an opposite surface of the backlight unit 160 to an adjacent surface to the image display panel 150.

The image display panel 150 may include a thin film transistor (TFT) substrate 151 on which a pixel electrode is connected to TFTs included in pixels, and a color filter substrate 153 formed on a glass substrate facing the TFT substrate 151.

When the PCB 110 is fixed, the FPC 120 is bent from the image display panel 150 so as to surround a lateral surface of the backlight unit 160.

Referring to FIG. 9B, the image display apparatus 10b may include the PCB 110 fixed at the lateral surface of the backlight unit 160 adjacent to the image display panel 150. The PCB 110 may be fixed adjacent to the lateral surface of the backlight unit 160, and the FPC 120 may be bent in a perpendicular direction to a surface of the image display panel 150.

In FIG. 9B, since the PCB 110 is fixed at the lateral surface of the backlight unit 160, the image display apparatus 10b is slim, and the FPC 120 is negligibly deformed.

According to example embodiments of the inventive concepts, an image display panel assembly and an image display apparatus including the image display panel assembly may have an improved structure in which gate and source driving signals are provided through a FPC substrate including a PCB and an image display panel, compared with a case where driver IC packages include gate and source driver ICs for processing gate and source driving signals that are bonded directly to a PCB substrate so as to receive driving signals.

Thus, one end of each of gate and source driver IC packages is bonded to the image display panel, and the other end is not bonded to the image display panel, thereby preventing patterns of each of gate and source driver IC packages from being damaged.

In addition, both the gate and source driver IC packages may include input and output patterns that extend towards the image display panel, and thus the number of PFs of a base substrate included in the gate and source driver IC packages may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image display panel assembly, comprising:
   a printed circuit board (PCB) that includes a semiconductor chip configured to provide a gate driving signal and a source driving signal;
   a flexible printed circuit (FPC) that has a first end that is bonded to, and electrically connected to, the PCB, the FPC including,
      a source signal pattern configured to receive the source driving signal from the semiconductor chip, and
      a gate signal pattern that is separate from the source signal pattern and configured to receive the gate driving signal from the semiconductor chip;
   an image display panel electrically connected to a second end of the FPC, the image display panel including gate driving signal transfer patterns along a first edge of the image display panel, source driving signal transfer patterns along a second edge adjacent to the first edge, and a plurality of pixels;
   a plurality of gate driver integrated circuit (IC) packages configured to receive the gate driving signal through the gate signal pattern and the gate driving signal transfer patterns, and configured to provide the gate driving signal to gate lines of the plurality of pixels; and
   a plurality of source driver IC packages being directly bonded to the image display panel along the second edge of the image display panel, and configured to receive the source driving signal through the source signal pattern and the source driving signal transfer patterns, and configured to provide the source driving signal to source lines of the plurality of pixels,
   wherein one source driver IC package is electrically connected to the source driving signal transfer patterns of a first number, and another source driver IC package is electrically connected to the source driving signal transfer patterns of a second number less than the first number.

2. The image display panel assembly of claim 1, wherein the one source driver IC package is configured to receive the source driving signal through the source driving signal transfer patterns, and configured to transfer the source driving signal to an adjacent source driver IC package and to provide the source driving signal to the image display panel.

3. The image display panel assembly of claim 2, wherein the one source driver IC package include source driving signal input patterns electrically connected to a source driver IC and receives the source driving signal, and
 a sorted source driving signal transfer patterns electrically connected to the source driver IC, the sorted source driving signal transfer patterns configured to output a sorted source driving signal that is sorted by the source driver IC to other source driver IC package.

4. The image display panel assembly of claim 2, wherein the one source driver IC package includes a source driving signal via pattern configured to bypass the one source driver IC package and output the source driving signal to other source driver IC package.

5. The image display panel assembly of claim 1, wherein the another source driver IC package is configured to receive the source driving signal through the source driving signal transfer patterns, and to provide the source driving signal to the image display panel.

6. The image display panel assembly of claim 1, wherein the one source driver IC package and the another source driver IC package include source driving signal output patterns that are electrically connected to a source driver IC and configured to provide the source driving signal to the source lines of the plurality of pixels, and
 wherein the number of the driving signal output patterns in the one source driver IC package is the same as the number of the driving signal output patterns in the another source driver IC package.

7. The image display panel assembly of claim 1, each of source driver IC packages includes,
 a base substrate including a flexible insulating material, and the base substrate not being bonded to the PCB,
 a source driver IC mounted on the base substrate and configured to receive and provide the source driving signal,
 a source driving signal input pattern electrically connected to the source driver IC and receives the source driving signal, and
 a source driving signal output pattern that is electrically connected to the source driver IC and configured to provide the source driving signal to the source lines of the plurality of pixels.

8. The image display panel assembly of claim 5, wherein the source driving signal input pattern and the source driving signal output pattern both extend from the source driver IC towards the image display panel.

9. The image display panel assembly of claim 1, wherein the FPC is on a corner portion between the first edge and the second edge of the image display panel.

10. The image display panel assembly of claim 1, wherein the FPC is on a portion of the second edge of the image display panel.

11. The image display panel assembly of claim 1, wherein one gate driver IC package is electrically connected to the gate driving signal transfer patterns of a first number, and another gate driver IC package is electrically connected to the gate driving signal transfer patterns of a second number less than the first number.

12. The image display panel assembly of claim 1, wherein the gate driving signal transfer patterns of the one gate driver IC package are electrically connected to the FPC and are connected the another gate driver IC package.

13. An image display panel assembly, comprising:
 a printed circuit board (PCB) that includes a semiconductor chip configured to provide a gate driving signal and a source driving signal;
 a flexible printed circuit (FPC) that has a first end that is bonded to, and electrically connected to, the PCB, the FPC including,
  a source signal pattern configured to receive the source driving signal from the semiconductor chip,
  a gate signal pattern that is separate from the source signal pattern and configured to receive the gate driving signal from the semiconductor chip, and
  a source and gate signal pattern configured to receive the source and gate driving signals from the semiconductor chip;
 an image display panel electrically connected to a second end of the FPC, the image display panel including gate driving signal transfer patterns along a first edge of the image display panel, source driving signal transfer patterns along a second edge adjacent to the first edge, and a plurality of pixels;
 a plurality of gate driver integrated circuit (IC) packages configured to receive the gate driving signal through the gate signal pattern, the source and gate signal pattern and the gate driving signal transfer patterns, and configured to provide the gate driving signal to gate lines of the plurality of pixels; and
 a plurality of source driver IC packages being directly bonded to the image display panel along the second edge of the image display panel, and configured to receive the source driving signal through the source signal pattern, the source and gate signal pattern, and the source driving signal transfer patterns, and configured to provide the source driving signal to source lines of the plurality of pixels,
 wherein the FPC is bonded to a portion of the second edge of the image display panel, one source driver IC package is electrically connected to the source driving signal transfer patterns of a first number, and another source driver IC package is electrically connected to the source driving signal transfer patterns of a second number less than the first number.

14. The image display panel assembly of claim 13, the FPC is bonded to a central portion between source driver IC packages.

15. The image display panel assembly of claim 13, the image display panel further includes a via gate driving signal transfer patterns along the second edge of the image display panel, and the gate driver IC packages are configured to directly receive the gate driving signal through the via gate driving signal transfer patterns, and configured to transfer the gate driving signal to an adjacent gate driver IC package or to provide the gate driving signal to the image display panel.

16. The image display panel assembly of claim 15, a first group of the source driver IC packages is disposed on the via gate driving signal transfer patterns and a second group of the source driver IC packages is disposed on the image display panel.

17. The image display panel assembly of claim 16, the first group of the source driver IC packages and the second group of the source driver IC packages includes the one source driver IC package and the another source driver IC package, respectively.

18. An image display panel assembly, comprising:
a printed circuit board (PCB) that includes a semiconductor chip configured to provide a gate driving signal and a source driving signal;
at least one flexible printed circuit (FPC) that has a first end that is bonded to, and electrically connected to, the PCB, the FPC including,
a source signal pattern configured to receive the source driving signal from the semiconductor chip, and
a gate signal pattern that is separate from the source signal pattern and configured to receive the gate driving signal from the semiconductor chip;
an image display panel electrically connected to a second end of the FPC, the image display panel including gate driving signal transfer patterns along a first edge of the image display panel, source driving signal transfer patterns along a second edge adjacent to the first edge, and a plurality of pixels;
a plurality of gate driver integrated circuit (IC) packages configured to receive the gate driving signal through the gate signal pattern, and the gate driving signal transfer patterns, and configured to provide the gate driving signal to gate lines of the plurality of pixels; and
a plurality of source driver IC packages being directly bonded to the image display panel along the second edge of the image display panel and being indirectly bonded via the FPC, and configured to receive the source driving signal through the source signal pattern, and the source driving signal transfer patterns, and configured to provide the source driving signal to source lines of the plurality of pixels,
wherein the at least one flexible printed circuits (FPC) is a plurality of flexible printed circuits and the at least one flexible printed circuits (FPC) is bonded to the second edge of the image display panel, and at least one gate driver integrated circuit (IC) package is bonded to the at least one FPC,
wherein one source driver IC package is electrically connected to the source driving signal transfer patterns of a first number, and another source driver IC package is electrically connected to the source driving signal transfer patterns of a second number less than the first number.

19. The image display panel assembly of claim 18, wherein the at least one FPC is bonded to corner portion of the second edge of the image display panel.

20. The image display panel assembly of claim 17, wherein each of source driver IC packages includes,
a base substrate, having a first end and a second end opposite to the first end, the first end of the base substrate being bonded to the image display panel, the base substrate including a flexible insulating material, and the second end of the base substrate not being bonded to the PCB.

* * * * *